United States Patent [19]  [11] Patent Number: 5,166,570
Takahashi  [45] Date of Patent: Nov. 24, 1992

[54] ELECTRONIC COMPONENT

[75] Inventor: Hiroyuki Takahashi, Himishi, Japan

[73] Assignee: Murata Manufacturing Co. Ltd., Nagaokakyo, Japan

[21] Appl. No.: 711,781

[22] Filed: Jun. 7, 1991

[30] Foreign Application Priority Data

Jun. 8, 1990 [JP] Japan .................. 2-150737

[51] Int. Cl.⁵ .......................... H01L 41/08
[52] U.S. Cl. .................. 310/320; 310/340; 310/348; 174/52.4; 439/68; 439/69; 439/70; 439/72; 439/73; 257/522; 257/678
[58] Field of Search ............ 310/320, 340, 348; 361/306, 307, 308, 309, 405; 174/52.4; 439/68, 69, 70, 72, 73; 357/74, 74 A, 74 B, 74 CF, 69, 70

[56] References Cited

U.S. PATENT DOCUMENTS

| 3,747,176 | 7/1973 | Toyoshima | 310/320 |
| 4,246,627 | 1/1981 | Poensgen | 361/405 |
| 4,360,754 | 11/1982 | Toyoshima et al. | 310/348 |
| 4,486,817 | 12/1984 | Matsumura et al. | 361/405 |
| 4,630,170 | 12/1986 | Kask et al. | 361/306 |
| 4,920,296 | 4/1990 | Takahashi et al. | 310/348 |

FOREIGN PATENT DOCUMENTS

| 0098051A3 | 1/1984 | European Pat. Off. |
| 2817212 | 5/1979 | Fed. Rep. of Germany | 310/348 |
| 2326039 | 9/1976 | France. |
| 0222568 | 9/1990 | Japan | 357/74 |

Primary Examiner—Mark O. Budd
Assistant Examiner—Thomas M. Dougherty
Attorney, Agent, or Firm—Armstrong & Kubovcik

[57] ABSTRACT

A radial lead type electronic component includes a couple of plate-type lead terminals projecting from a protective resin member in the same direction. These lead terminals are provided with inclined edges, which make the body portions gradually narrowed toward leg portions, in leg-side edges of body portions. Among inclined edges, inclinations $\theta_1$ of the outer ones with respect to the leg-projecting direction are greater than inclinations $\theta_2$ of the inner ones with respect to the same direction. Thus, the electronic component is relieved from stresses which are applied thereto upon insertion in a printed circuit board or a cut-and-clinch operation.

10 Claims, 10 Drawing Sheets

ELECTRONIC COMPONENT

BACKGROUND OF THE INVENTION

The present invention relates to an electronic component, and more particularly, it relates to a radial lead type electronic component which comprises a plurality of plate-type lead terminals projecting from its protective resin member in the same direction.

Figure 18:
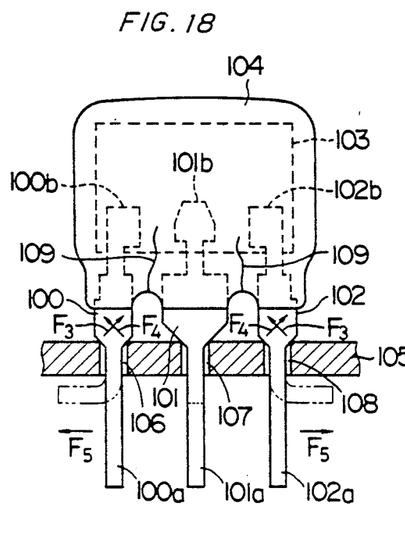
FIG. 18 is a partially fragmented front elevational view showing a conventional three-terminal electronic component, which is inserted in a printed circuit board.

FIG. 18 shows a well-known electronic component for automatic insertion, which is mounted on a printed circuit board by an automatic inserter. This electronic component comprises three plate-type lead terminals 100, 101 and 102 of punched metal plates, which are provided with elongated leg portions 100a, 101a and 102a projecting in a common plane from a protective resin member 104 in the same direction. Head portions 100b, 101b and 102b of the lead terminals 100 to 102 are soldered to an element 103, and the protective resin member 104 seals the periphery of the element 103 including the head portions 100b to 102b.

Figure 19:
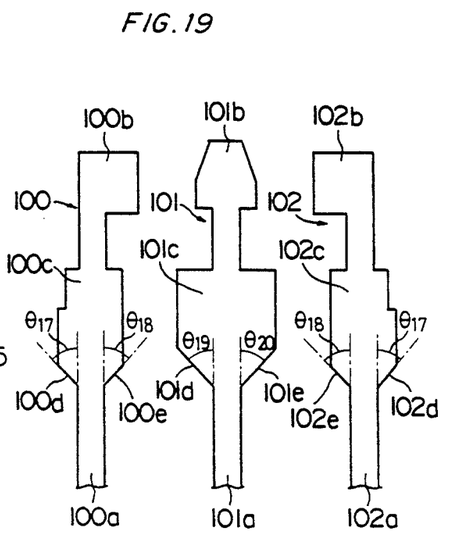
FIG. 19 is a partially enlarged view showing lead terminals provided in the electronic component shown in FIG. 18.

As shown in FIG. 19, wide body portions 100c, 101c and 102c are provided between the leg portions 100a to 102a and the head portions 100b to 102b of the lead terminals 100 to 102. These body portions 100c to 102c are provided on legside ends with inclined edges 100d, 100e, 101d, 101e, 102d and 102e, which define positions for stopping insertion in through holes 106, 107 and 108 of a printed circuit board 105. The inclined edges cause the body portions to gradually taper toward the leg portions, in order to relieve the component from a shock applied upon insertion in the through holes 106 to 108, as well as to bite into upper edges of the through holes 106 to 108 so that the component will be retained on the printed circuit board 105. The inclined edges are bilaterally symmetrical, such that inclinations $\theta_{17}$ of the outer inclined edges 100d and 102d of the outer lead terminals 100 and 102, inclinations $\theta_{18}$ of the inner inclined edges 100e and 102e thereof and inclinations $\theta_{19}$ and $\theta_{20}$ of the outer inclined edges 101d and 101e of the central lead terminal 101 are equal to each other, as follows:

$$\theta_{17}=\theta_{18}=\theta_{19}=\theta_{20}$$

The above described prior art component is disadvantageous in that portions of the protective resin member 104 between the central lead terminal 101 and the outer lead terminals 100 and 102 are apt to cause cracks 109 as shown in FIG. 18, or may be ruptured when the component is inserted in the printed circuit board by an inserter. Such cracking of the protective resin member 104 leads to defective sealing, breakage of the element 103, defective connection between the element 103 and the lead terminals 100 to 102, and the like.

The cracks 109 or rupture of the protective resin member 104 may occur at the following two stages:

When the element is automatically inserted in the printed circuit board 105, the component body is chucked by an automatic inserter and the leg portions 100a to 102a of the lead terminals 100 to 102 are first inserted in the through holes 106 to 108 of the printed circuit board 105, and then the top surface of the electronic component is driven by a pusher so that the inclined edges bite into the edges of the through holes 106 to 108. First stage cracking occurs at this time. If the pitch centers of the through holes 106 to 108 are completely aligned with those of the lead terminals 100 to 102, the inclined edges 100d, 100e, 102d and 102e of the outer lead terminals 100 and 102 simultaneously strike the upper edges of the through holes 106 and 108, so that reactive forces $F_3$ and $F_4$ acting on side edges of the lead terminals 100 and 102 cancel each other and apply no bending stress to the electronic component. In practice, however, the side edges of the outer lead terminals 100 and 102 may not uniformly strike the through holes 106 and 108 due to dimensional errors between the pitches of the through holes 106 to 108 and the lead terminals 100 to 102, chuck error of the automatic inserter, etc., but only the inner inclined edges 100e and 102e of the lead terminals 100 and 102 may strike the upper edges of the through holes 106 and 108. In this case, only the reactive forces $F_4$ caused by driving of the top surface of the component, acts to externally tear the outer lead terminals 100 and 102. It is to be noted that the protective resin is fairly resistant to a compressive stress while it is extremely weak against a tensile stress. For example, the tensile strength of phenol denatured epoxy resin, which is widely applied to a protective resin member for a piezoelectric component, is merely a little less than 40% of its compressive strength. Therefore the protective resin member 104 is easily cracked when such tearing force $F_4$ acts on the lead terminals 100 and 102 externally.

Second-stage cracking occurs in a cut-and-clinch operation. After the top surface of the electronic component is driven by the pusher as mentioned above, lower parts of the leg portions coming out through the holes 106 to 108 are shortened by cutting and clinched at one time. The outer lead terminals 100 to 102 are outwardly clinched as shown by two-dot chain lines in FIG. 18, and the central lead terminal 101 is transversely clinched. This cut-and-clinch operation goes on while the top surface of the component is continuously pressed by the pusher. At this time, cut-and-clinch forces $F_5$ for the outer lead terminals 100 and 102 act in a direction which will increase the reactive forces $F_4$ caused by pressing the top surface, whereby a larger force acts on the component due to outward pulling on the outer lead terminals 100 and 102. Consequently, the protective resin member 104, which has been almost cracked at the first stage, is completely cracked at this second stage.

Figure 20:
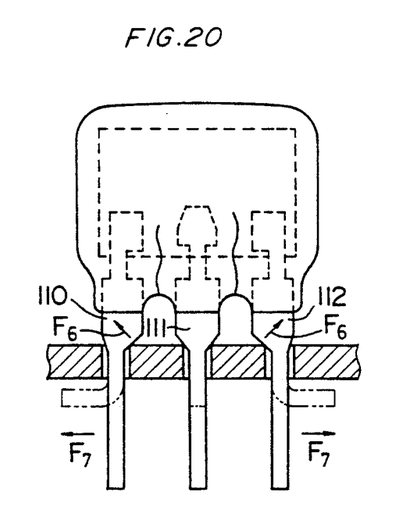
FIG. 20 is a partially fragmented front elevational view showing another conventional three-terminal electronic component, which is inserted in a printed circuit board.
Figure 21:
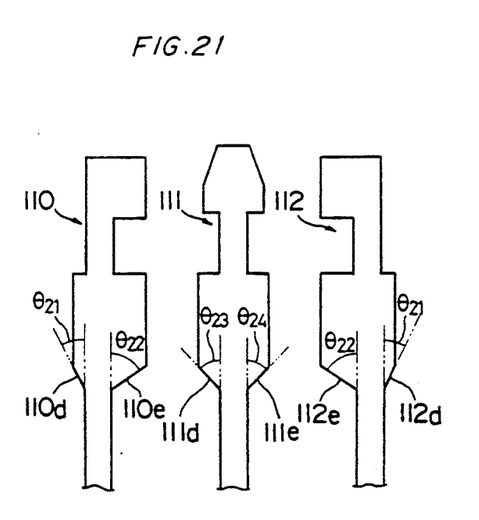
FIG. 21 is a partially enlarged view showing lead terminals provided in the electronic component shown in FIG. 20.

The aforementioned problem also takes place in another type of electronic component having terminal configurations shown in FIGS. 20 and 21. In this case, inclined edges 110d, 110e, 112d and 112e of outer lead terminals 110 and 112 are asymmetrical, such that inclinations $\theta_{22}$ of the inner inclined edges 110e and 112e are greater than inclinations $\theta_{21}$ of the outer inclined edges 110d and 112d. On the other hand, a central lead terminal 111 has symmetrical inclined edges 111d and 111e. The inclinations are set as follows:

$$\theta_{21}<\theta_{23}=\theta_{24}<\theta_{22}$$

In this case, reactive forces $F_6$, which are caused when a top surface of the component is driven by the pusher, regularly act in a direction for outwardly pulling the lead terminals 110 and 112, while cut-and-clinch forces $F_7$ act to increase the reactive forces $F_6$. Thus, the rate of occurrence of defects is increased as compared with the component shown in FIG. 18.

It is possible to solve the aforementioned problems by improving the strength of the protective resin member.

However, various characteristics are required for the protective resin member. For example, especially in the case of an energy trapped type ceramic resonator, since the process of its production includes cavity-forming as described in U.S. Pat. No. 3,747,176, the protective resin member is possibly required the following two properties besides strength: being able to absorb cavity-forming materials such as wax when heated, casting not too much shrinkage stress on an internal ceramic element when hardened. In practice, it has been extremely difficult to develop a protective resin member which can satisfy all such conditions, due to conflicting requirements therefor. As the result, it has been impossible to exclusively improve the strength of the protective resin member and to prevent the aforementioned defects, and reliability has been thus reduced. The aforementioned problems may be caused not only in an electronic component for automatic insertion, but also in that for manual insertion, i.e., the so-called bulk component, which is not cut and clinched. When the electronic component is pressed on a printed circuit board so that it is attached thereto, the first-stage cracking may occur.

SUMMARY OF THE INVENTION

A principal object of the present invention is to provide an electronic component, which can prevent or greatly reduce defects such as those caused by resin cracking, such cracking being caused when the component is inserted in through holes of a printed circuit board.

Another object of the present invention is to provide an electronic component whose protective resin member may have relatively low strength, so that a wider range of materials are available for the protective resin member.

Still another object of the present invention is to provide an electronic component which can tolerate slight dimensional errors between pitches of through holes and lead terminals as well as chuck error of an automatic inserter, so that the component is suitable for mass production at low manufacturing cost.

An electronic component according to one preferred embodiment of the present invention comprises an element, a protective resin member sealing the periphery of the element, and a couple of plate-type lead terminals projecting from the protective resin member in the same direction. The lead terminals have head portions which are connected to the element, elongated leg portions, and intermediate body portions which are wider than the leg portions and positioned at sealing lines of the protective resin member. The body portions of the lead terminals are provided on leg-side edges with inclined edges, which make the body portions gradually narrowed toward the leg portions. Inclinations $\theta_1$ of the outer inclined edges with respect to the leg-projecting direction are greater than inclinations $\theta_2$ of the inner inclined edges with respect to the same direction, while lowest ends of the outer inclined edges are at the same level with those of the inner inclined edges. The term "lowest ends" indicates crosspoints between the inclined edges and the side edges of the leg portions. Further, the "same level" may be considered to include fine dimensional errors (generally about ±0.1 mm) which may be caused during punch working, in addition to a strictly identical level.

When the lead terminals of the aforementioned electronic component are inserted in through holes of a printed circuit board by an automatic inserter and the top surface of the electronic component is driven, the inclined edges of the lead terminals bite into the upper edges of the through holes, to be stopped. Since the inclinations $\theta_1$ of the outer inclined edges of the lead terminals are greater than the inclinations $\theta_2$ of the inner inclined edges, the outer inclined edges further possibly strike the upper edges of the through holes as compared with the inner inclined edges, regardless of slight dimensional errors and chuck error. Therefore, the lead terminals are inwardly pressed by the reactive forces $F_2$ from the printed circuit board, oppositely to an outward direction. Such force serves as a compressive stress for the protective resin member, whereby it is possible to prevent or suppress first-stage cracking of the protective resin member. Then the lead terminals are cut and clinched while the top surface of the electronic component is pressed by a pusher. At this time, since the outer inclined edges of the lead terminals are still pushing the upper edges of the through holes, reactive forces $F_2$ act on the lead terminals inwardly, against cut-and-clinch forces $F_1$. Namely, these forces $F_1$ and $F_2$ cancel with each other, thereby reducing stresses acting on the electronic component. Thus, it is possible to prevent or suppress second-stage cracking of the protective resin member.

Since high sealing performance is required for an electronic component which is sealed with resin, a countermeasure for resin cracking is important. According to the present invention, even if the protective resin member itself is not high in strength, resin cracking hardly occurs because the reactive forces $F_2$ on the resin member act compressively at the first stage, and two forces $F_1$ and $F_2$ cancel each other at the second stage.

In the case of a piezoelectric component, it is necessary to reduce shrinkage stress of its protective resin member when hardened since a piezoelectric ceramic element is extremely fragile against an external stress. In the case of an energy trapped type ceramic resonator, further, it is impossible to excessively increase strength of a protective resin member since the resin may also have capability of absorbing cavity-forming materials such as wax. According to the present invention, not so high strength is required for the protective resin member, whereby it is possible to relatively easily attain consistency of reduction of shrinkage stress and capability of absorbing cavity-forming materials, and the range for selection of the resin material is widened. This means that it is possible to obtain a highly reliable piezoelectric component with an existing resin material. While application of conventional piezoelectric components for automatic insertion has been delayed due to a high rate of defects, it is possible to accelerate application for automatic insertion by using piezoelectric components according to the present invention.

While dimensional variations between pitches of lead terminals and through holes as well as chuck error of an automatic inserter necessarily take place in an actual production process, no resin cracking is caused in the present invention even if allowable ranges for such errors are increased, whereby it is easy to manage the component dimensions, and the manufacturing cost can be reduced.

In this electronic component, the inclinations $\theta_1$ of the outer inclined edges are preferably set to be about 43°, so that biting into the through holes of the printed circuit board, i.e., attachment to the printed circuit board of the electronic component, is consistent with prevention of cracking of the protective resin member. However, the inclinations $\theta_1$ may be varied by about $\pm 5°$ in working.

A similar effect can be expected by another preferred embodiment of the present invention further comprising a central plate-type lead terminal between the aforementioned two lead terminals. The central lead terminal is preferably provided with a head portion, a leg portion and a body portion, similarly to outer lead terminals. Further, it is preferable to provide inclined edges which make the body portion gradually narrowed toward the leg portion on both side edges of the central lead terminal so that inclinations $\theta_3$ and $\theta_4$ of the inclined edges with respect to the leg-projecting direction are equivalent to inclinations $\theta_1$ of the outer inclined edges of the outer lead terminals. Moreover, the lowest ends of the inclined edges should preferably be at the same level with those of the outer inclined edges of the outer lead terminals. In this case, inclined edges of the central lead terminal and the outer inclined edges of the outer lead terminals simultaneously strike the upper edges of the through holes of the printed circuit board when the top surface of the component is driven. Thus, it is possible to uniformly receive reactive forces, which are caused upon insertion in the printed circuit board, by the three lead terminals, to reduce burdens applied to the outer lead terminals.

Existing automatic inserters previously known cannot cut and clinch four or more lead terminals. To this end, there has been proposed an electronic component which comprises four or more plate-type lead terminals, so that only three adjacent ones of the lead terminals are cut and clinched. In the case of such an electronic component comprising four or more lead terminals, inclined edges provided on outer ones of the three clinched lead terminals are structured similarly to the above, so that it is possible to reduce stresses which act on the electronic component upon automatic insertion.

According to the present invention, a similar effect can also be expected by simply providing inclined edges only on outer side edges of lead terminals. In this case, only the outer inclined edges strike upper edges of the through holes, since the lead terminals have no inner inclined edges. Therefore, even if there exists slight dimensional variation or chuck error before the top surface of the component is driven, it is possible to inwardly urge the lead terminals in a compressive direction with high reliability, in order to suppress cracking of the protective resin member.

According to the present invention, further, a similar effect can be expected also when lowest ends of the outer inclined edges of the lead terminals are displaced from those of the inner inclined edges in the leg-side direction. The amount of such displacement may be small if the inclinations of the outer inclined edges are equivalent to or greater than those of the inner inclined edges. However, the lowest ends of the inner inclined edges are preferably higher than portions of the outer inclined edges striking the upper edges of the through holes if the inclinations of the inner inclined edges are greater than those of the outer inclined edges. Also in this case, only the outer inclined edges of the lead terminals strike the through holes, whereby it is possible to inwardly urge the lead terminals in the compressive direction with high reliability upon pushing.

These and other objects, features, aspects and advantages of the present invention will become apparent from the following detailed description of the present invention when taken in conjunction with the accompanying drawings.

DETAILED DESCRIPTION OF THE PREFERRED EMBODIMENTS

Figure 1:
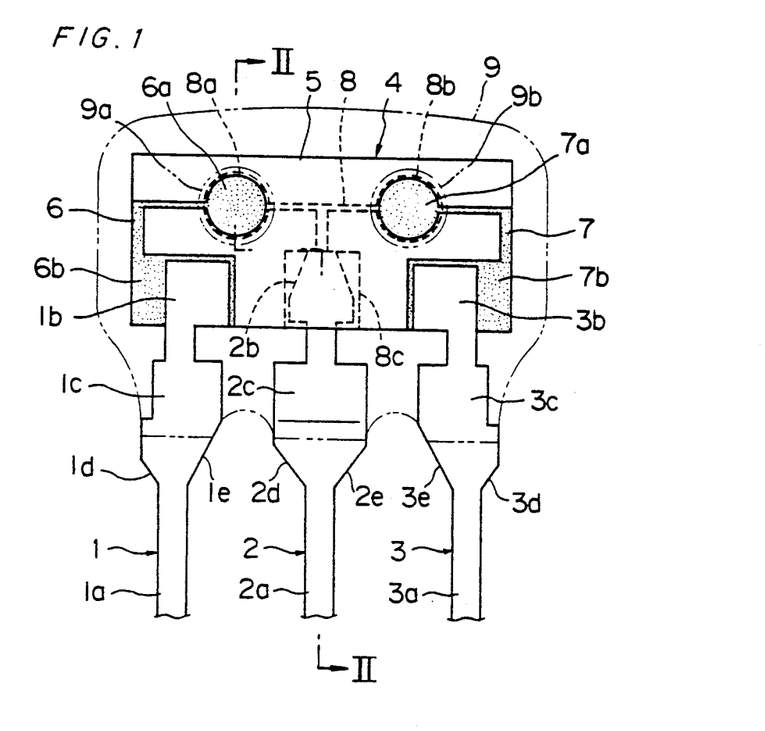
FIG. 1 is a front elevational view showing a three-terminal electronic component according to an embodiment of the present invention.
Figure 2:
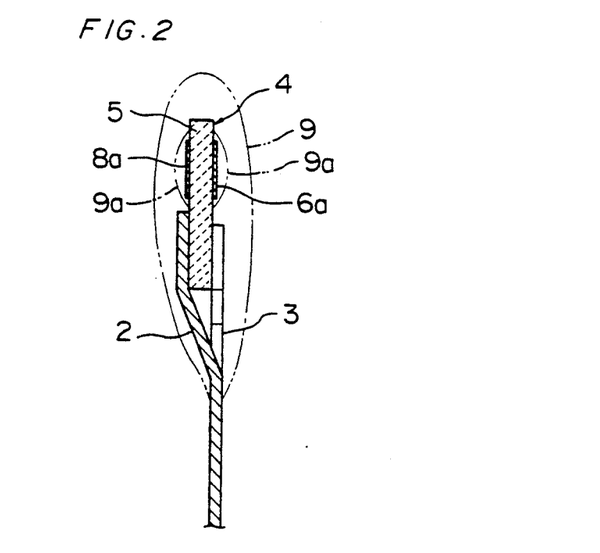
FIG. 2 is a sectional view taken along the line II—II in FIG. 1.

FIGS. 1 and 2 show an electronic component according to an embodiment of the present invention. This electronic component comprises an element 4, a protective resin member 9 sealing the periphery of the element 4, and three plate-type lead terminals 1, 2 and 3 projecting in a common plane from the protective resin member 9 in the same direction. The element 4 of this embodiment is a well-known energy trapped type three-terminal trap vibrating in a thickness shear mode, which comprises a piezoelectric ceramic substrate 5 and electrodes 6, 7 and 8 provided on front and back major surfaces thereof. Input and output electrodes 6 and 7, which are provided on the front major surface of the piezoelectric ceramic substrate 5, comprise circular vibrating electrodes 6a and 7a and terminal electrodes 6b and 7b, while a ground electrode 8 provided on the back major surface comprises two circular vibrating electrodes 8a and 8b, which are opposite to the vibrating electrodes 6a and 7a, and a terminal electrode 8c.

Figure 3:
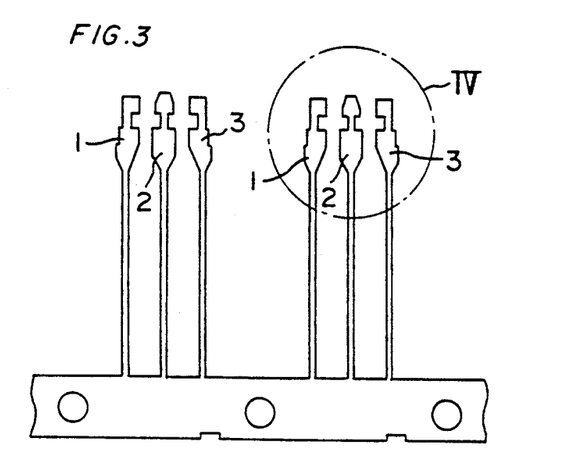
FIG. 3 is a front elevational view showing a lead frame which is provided with lead terminals of the electronic component shown in FIG. 1.

As shown in FIG. 3, the lead terminals 1 to 3 are integrally punched from one metal plate. These lead terminals 1 to 3 are formed by elongated leg portions 1a, 2a and 3a, head portions 1b, 2b and 3b, and body portions 1c, 2c and 3c, which are wider than the leg portions 1a to 3a, provided between the head portions 1b to 3b and the leg portions 1a to 3a. The head portions 1b to 3b of the outer lead terminals 1 and 3 are connected and fixed to the terminal electrodes 6b and 7b of the input and output electrodes 6 and 7 of the element 4 with means such as soldering, while the head portion 2b of the central lead terminal 2 is connected and fixed to the terminal electrode 8c of the ground electrode 8 of the element 4 with similar means. In order to planarly arrange the leg portions 1a to 3a of all lead terminals 1 to 3, the central lead terminal 2 is transversely bent at its body portion 2c by the thickness of the element 4, as shown in FIG. 2.

Figure 4:
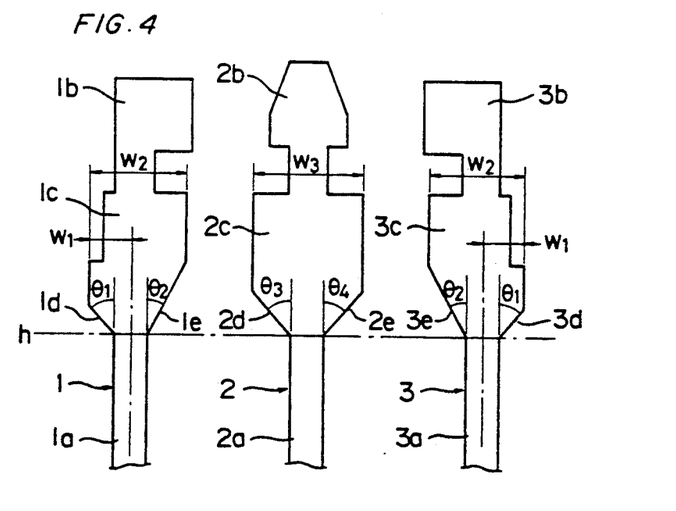
FIG. 4 is a partially enlarged view showing a part IV in FIG. 3.

As shown in FIG. 4, the body portions 1c to 3c of the lead terminals 1 to 3 are provided on leg-side ends with inclined edges 1d, 1e, 2d, 2e, 3d and 3e, which make the body portions gradually narrowed toward the leg portions 1a to 3a, with lowest end positions h being set at the same level. Among these, the inclined edges 1d, 1e, 3d and 3e of the outer lead terminals 1 and 3 are laterally asymmetrical while the inclined edges 2d and 2e of the central lead terminal 2 are laterally symmetrical. Assuming that the term "inclinations" indicates angles of the inclined edges with respect to the leg-projecting direction, relations between inclinations $\theta_1$ of the outer inclined edges 1d and 3d of the outer lead terminals 1 and 3, inclinations $\theta_2$ of the inner inclined edges 1e and 3e thereof and inclinations $\theta_3$ and $\theta_4$ of the inclined edges 2d and 2e of the central lead terminal 2 are set as follows:

$$\theta_3 = \theta_4 = \theta_1 > \theta_2$$

Assuming that $W_1$ represents widths between the leg centers and the outer side edges of the body portions 1c and 3c of the outer lead terminals 1 and 3, and that d represents the diameters of through holes which are provided in a printed circuit board as described later, it is necessary to attain the following relation:

$$2W_1 > d$$

A width $W_3$ of the body portion 2c of the central lead terminal 2 is greater than widths $W_2$ of the body portions 1c and 3c of the outer lead terminals 1 and 3.

The protective resin member 9 is provided by dip coating in the periphery of the element 4, including the head portions 1b to 3b of the lead terminals 1 to 3, so that the sealing line of the protective resin member 9 is located on the wide body portions 1c to 3c. The protective resin member 9 is provided in portions corresponding to the vibrating electrodes 6a, 8a, 7a and 8b of the element 4 with cavities 9a and 9b, which serve as vibration spaces. A method of forming such cavities 9a and 9b is described in U.S. Pat. No. 3,747,176.

Figure 5:
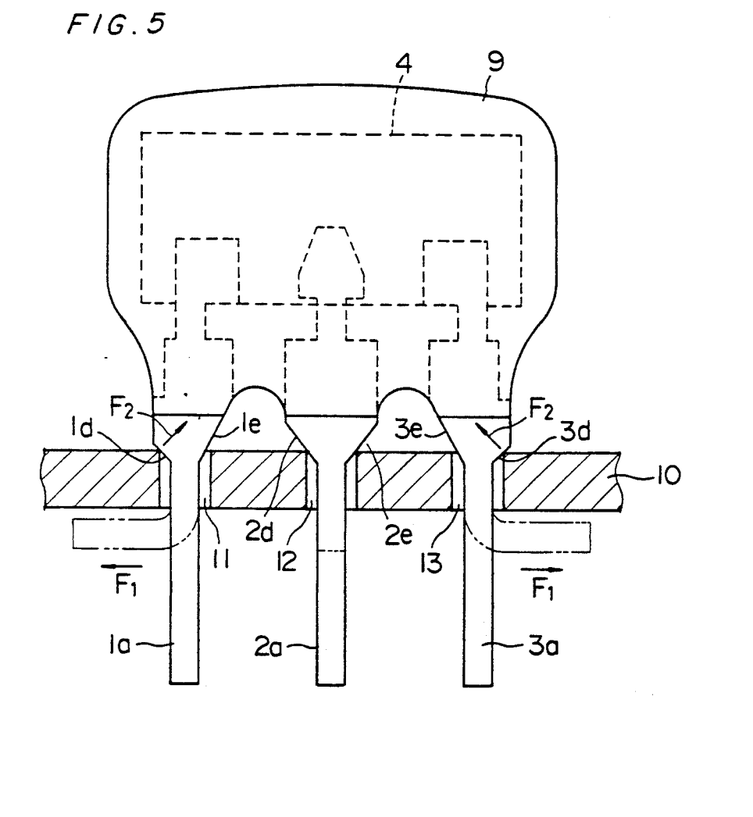
FIG. 5 is a partially fragmented front elevational view showing the electronic component of FIG. 1, which is inserted in a printed board.

An operation for automatically inserting the electronic component of the aforementioned structure in a printed circuit board 10 is now described with reference to FIG. 5.

First, the front and back surfaces of the protective resin member 9 are chucked by an automatic inserter, and the lead terminals 1 to 3 are inserted in through holes 11, 12, and 13 of the printed circuit board 10. Then the top surface of the electronic component is driven by a pusher so that the inclined edges bite into upper edges of the through holes 11 to 13, and thereafter lower parts of the lead terminals 1 to 3 downwardly coming out through the printed circuit board are shortened by cutting and clinched at one time, the outer lead terminals 1 to 3 are outwardly clinched as shown by two-dot chain lines in FIG. 5, and the central lead terminal 2 is transversely clinched. This cut-and-clinch operation goes on while the top surface of the component is continuously pressed by the pusher. Thus, the lead terminals 1 to 3 are exposed to reactive forces $F_2$, which are caused by driving of the top surface, and stresses $F_1$, which are caused by the cut-and-clinch operation.

Assuming that the centers of the through holes 11 to 13 are aligned with pitch centers of the lead terminals 1 to 3, the inclined edges 2d and 2e of the central lead terminal 2 and the outer inclined edges 1d and 3d of the outer lead terminals 1 and 3 substantially simultaneously bite into the upper edge portions of the through holes 11 to 13. Since their inclinations $\theta_3$ and $\theta_4$ of the inclined edges 2d and 2e of the central lead terminal 2 are equal to each other, reactive forces acting on the inclined edges 2d and 2e cancel each other so that no lateral stress acts on the lead terminal 2. In the outer lead terminals 1 and 3, on the other hand, the outer inclined edges 1d and 3d bite into the upper edge portions of the through holes 11 and 13, whereby the reactive forces $F_2$ caused by beating of the top surface act inwardly on the lead terminals 1 and 3. Such forces $F_2$ urge portions of the protective resin member 9 located between the lead terminals 1 to 3 in a compressive direction, whereby it is possible to suppress first-stage cracking of the protective resin member 9. Then, the cut-and-clinch forces $F_1$ act on the lead terminals 1 and 3 substantially oppositely to the reactive forces $F_2$ caused by driving of the top surface, whereby the forces $F_1$ and $F_2$ cancel each other so that it is possible to reduce stresses acting on the electronic component. Consequently, it is possible to suppress second-stage cracking of the protective resin member 9.

In an actual automatic insertion step, the centers of the through holes 11 to 13 are not necessarily aligned with those of the lead terminals 1 to 3 when the electronic component is inserted in the printed circuit board 10, due to dimensional variation between the pitch centers of the through holes 11 to 13 and the lead terminals 1 to 3, chuck error of the automatic inserter, and the like. According to the present invention, however, the inclinations $\theta_1$ of the outer inclined edges 1d and 3d of the outer lead terminals 1 and 3 are greater than the inclinations $\theta_2$ of the inner inclined edges 1e and 3e, whereby the outer inclined edges 1d and 3d most probably strike the upper edge portions of the through holes 11 and 13 regardless of the dimensional variation and chuck error, and the reactive forces $F_2$ caused by driving of the top surface act inwardly on the outer lead terminals 1 and 3, substantially oppositely to the direction of the cut-and-clinch forces $F_1$. Thus, compressive stresses exclusively act on the portions of the protective resin member 9 located between the lead terminals 1 to 3, and it is possible to suppress cracking. This means that not so high accuracy is required for the pitches of the through holes 11 to 13 and the lead terminals 1 to 3, and for the operation of the automatic inserter. Consequently, this electronic component contributes to reduction of the manufacturing cost through mass production.

Automatic insertion tests were made on samples of the inventive electronic component having the aforementioned lead terminals 1 to 3 and comparative samples A and B of electronic components having the conventional lead terminals as shown in FIG. 18 and 20, under the following conditions:

The lead terminals prepared from a material of JIS: SPCE-SB, with board thicknesses of 0.3 mm and leg-portion widths of 0.5 mm, while protective resin members were prepared from phenol denatured epoxy resin. Inclinations of inclined edges provided in the comparative example A shown in FIG. 18, the comparative example B shown in FIG. 20 and the inventive example were set as follows;

Sample A: $\theta_{17} = \theta_{18} = \theta_{19} = \theta_{20} = 43°$

Sample B: $\theta_{21} = 24°$, $\theta_{22} = 57°$, $\theta_{23} = \theta_{24} = 43°$ Inventive Sample: $\theta_1 = \theta_2 = \theta_4 = 43°$, $\theta_2 = 26°$ These inclinations were slightly varied by about several degrees. Except for the lead terminals, the bodies of the samples were identical in conditions such as configurations, sizes and materials to each other.

Under the above conditions, 200 comparative samples A, 200 comparative samples B and 200 inventive samples were automatically inserted in printed circuit boards of 1.6 mm in thickness and 1.4 mm in through hole diameter with an existing automatic inserter TDK AVISERT VC-5. As the result, defects having cracking or breakage of the protective resin members were caused in 28% of the comparative samples and 47% of the comparative samples B, while no such defects were caused in the inventive samples. Thus, an excellent effect of the present invention has been demonstrated.

Figure 6:
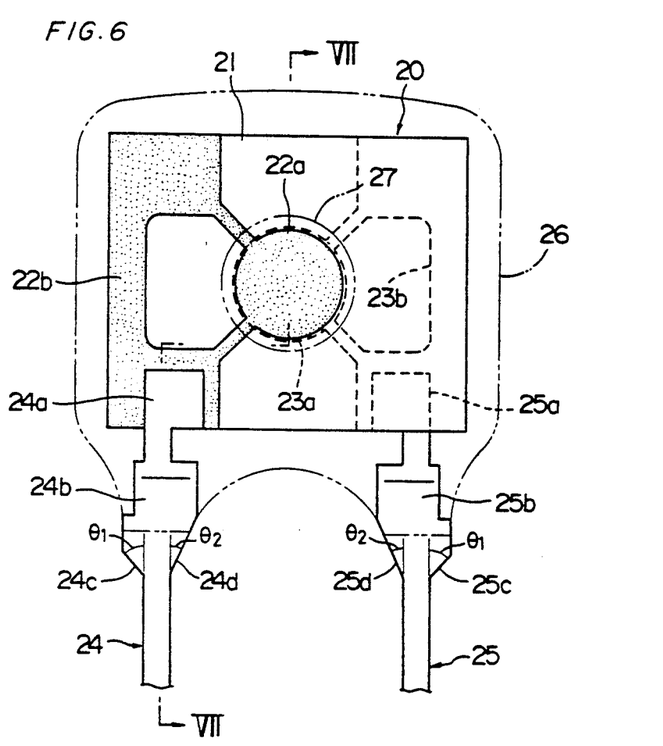
FIG. 6 is a front elevational view showing a two-terminal electronic component according to a second embodiment of the present invention.
Figure 7:
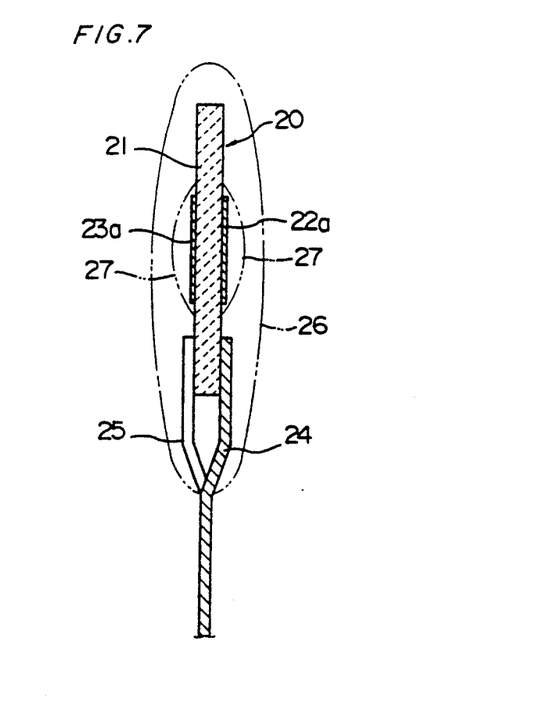
FIG. 7 is a sectional view taken along the line VII—VII in FIG. 6.

FIGS. 6 and 7 illustrate a two-terminal electronic component according to a second embodiment of the present invention. An element 20 of this embodiment is an energy trapped type oscillator vibrating in a thickness expansion mode, which comprises a piezoelectric ceramic substrate 21 and circular vibrating electrodes 22a and 23a oppositely provided on centers of front and back surfaces thereof. Terminal electrodes 22b and 23b are provided on symmetrical end portions on the front and back surfaces of the element 20, and head portions 24a and 25a of two lead terminals 24 and 25 are connected to the terminal electrodes 22b and 23b respectively. The configurations of the lead terminals 24 and 25 are similar to the outer lead terminals 1 and 3 of the first embodiment, except that the lead terminals 24 and 25 are oppositely bent in the transverse direction. The lead terminals 24 and 25 are provided on leg-side edges of body portions 24b and 25b with inclined edges 24c, 24d, 25c and 25d, such that inclinations $\theta_1$ of the outer inclined edges 24c and 25c are greater than inclinations $\theta_2$ of the inner inclined edges 24d and 25d. A protective resin member 26 seals the periphery of the element 20, including the head portions 24a and 25a of the lead terminals 24 and 25, while cavities 27 are formed in portions corresponding to the vibrating electrodes 22a and 23a.

This embodiment also attains an effect similar to that of the first embodiment.

Figure 8:
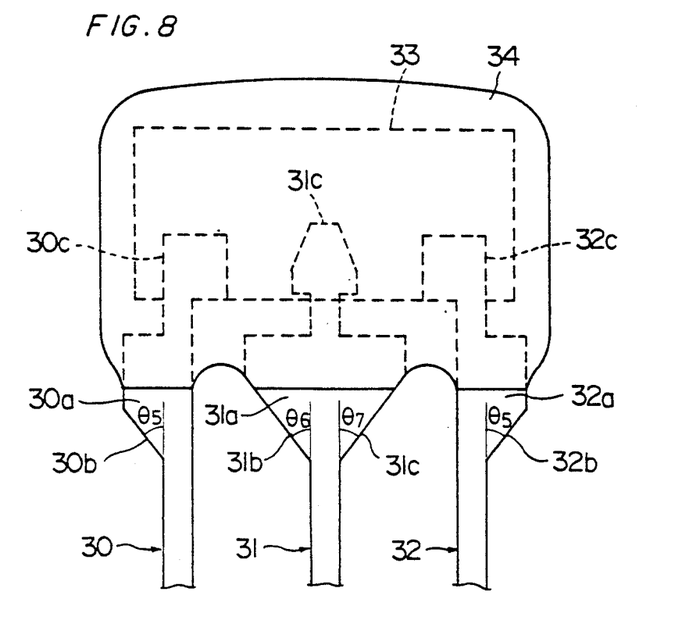
FIG. 8 is a front elevational view showing the appearance of a three-terminal electronic component according to a third embodiment of the present invention.

FIG. 8 shows a three-terminal electronic component according to a third embodiment of the present invention. Among three lead terminals 30, 31 and 32, the outer lead terminals 30 and 32 are provided only on outer leg-side edges of body portions 30a and 32a with inclined edges 30b and 32b having inclinations $\theta_5$. Inclinations $\theta_6$ and $\theta_7$ of inclined edges 31b and 31c, which are provided on a lowest end of a body portion 31a of the central lead terminal 31, are set to be substantially equivalent to the inclinations $\theta_5$, as follows:

$$\theta_5 = \theta_6 = \theta_7$$

Head portions 30c, 31c and 32c of these lead terminals 30 to 32 are connected to electrodes which are formed on front and back surfaces of an element 33 similarly to the first embodiment, and a protective resin member 34 seals the periphery of the element 33.

Since the outer lead terminals 30 and 32 have no inner inclined edges, the outer inclined edges 30b and 32b necessarily strike upper edges of through holes of a printed circuit board, whereby the outer lead terminals 30 and 32 can be inwardly pushed with high reliability, in addition to the effect of the first embodiment. In other words, it is possible to suppress cracking of the protective resin member 34 even if the degrees of dimensional variation and chuck error are larger as compared with the first embodiment.

Figure 9:
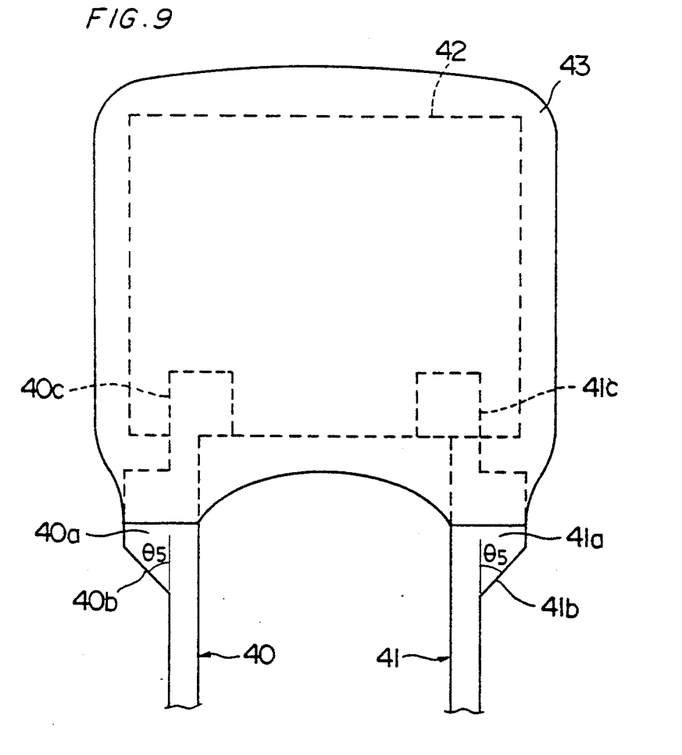
FIG. 9 is a front elevational view showing the appearance of a two-terminal electronic component according to a fourth embodiment of the present invention.

FIG. 9 shows a two-terminal electronic component according to a fourth embodiment of the present invention. Configurations of lead terminals 40 and 41 provided in this embodiment are substantially similar to the outer lead terminals 30 and 32 of the third embodiment. The lead terminals 40 and 41 are provided with inclined edges 40b and 41b having inclinations $\theta_5$, only on outer leg-side edges of body portions 40a and 41a. Head portions 40c and 41c of the lead terminals 40 and 41 are connected to electrodes provided on front back surfaces of an element 42, which is similar to that of the second embodiment. A protective resin member 43 seals the periphery of the element 42.

Figure 10:
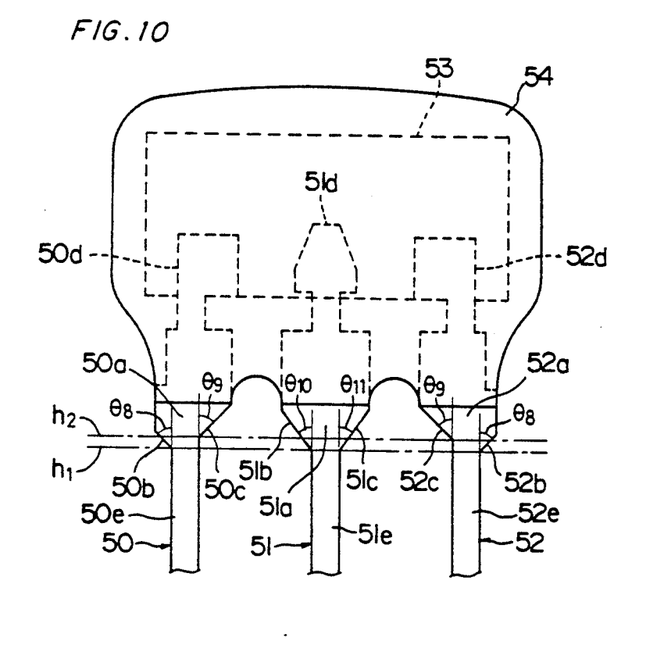
FIG. 10 is a front elevational view showing the appearance of a three-terminal electronic component according to a fifth embodiment of the present invention.

FIG. 10 shows another three-terminal electronic component according to a fifth embodiment of the present invention. Among three lead terminals 50, 51 and 52, the outer lead terminals 50 and 52 are provided with inclined edges 50b, 50c, 52b and 52c, which have different lowest ends, on both side edges of body portions 50a and 52a. According to this embodiment, inclinations $\theta_8$ of the outer inclined edges 50b and 52b are equivalent to inclinations $\theta_9$ of the inner inclined edges 50c and 52c.

Inclined edges 51b and 51c, which are provided on both side edges of a body portion 51a of the central lead terminal 51, are equivalent to the inclinations $\theta_8$ and $\theta_9$ of the inclined edges 50b, 50c, 52b and 52c of the outer lead terminals 50 and 52, as follows:

$$\theta_8=\theta_9=\theta_{10}=\theta_{11}$$

Lowest ends of the inclined edges 51b and 51c are set at the same level $h_1$ as lowest ends of the outer inclined edges 50b and 52b, and are lower than lowest end positions $h_2$ of the inner inclined edges 50c and 52c. Head portions 50d, 51d and 52d of the lead terminals 50, 51 and 52 are connected to electrodes provided on front and back surfaces of an element 53, which is similar to that of the first embodiment, while a protective resin member 54 seals the periphery of the element 53.

Since the lowest end positions $h_1$ of the inclined edges 51b and 51c and the outer inclined edges 50d and 52d are closer to leg portions 50e, 51e and 52e than lowest end positions $h_2$ of the inner inclined edges 50c and 52c, the inclined edges 51b and 51c and the outer inclined edges 50d and 52d necessarily strike upper edges of through holes which are provided in a printed circuit board, whereby the outer lead terminals 50 and 52 can be inwardly pressed with high reliability to suppress cracking of the protective resin member 54.

Figure 11:
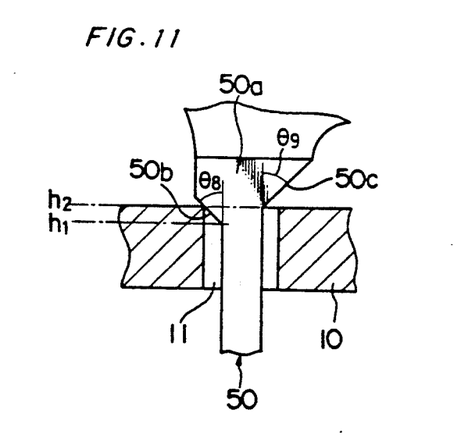
FIG. 11 is a sectional view showing a part of the electronic component according to a fifth embodiment, whose outer inclined edges are made smaller than inner inclined edges, inserted in a printed circuit board.

While the inclinations $\theta_8$ of the outer inclined edges 50b and 52b of the outer lead terminals 50 and 52 are rendered equivalent to the inclinations $\theta_9$ of the inner inclined edges 50c and 52c in the electronic component shown in FIG. 10, the former may be greater than the latter, and vice versa. If the inclinations $\theta_8$ are rendered smaller than the inclinations $\theta_9$, the lowest end positions $h_2$ of the inner inclined edges 50c and 52c are preferably made higher than portions of the outer inclined edges 50b and 52b striking upper edges of through holes 11 which are provided in a printed circuit board 10, as shown in FIG. 11.

Figure 12:
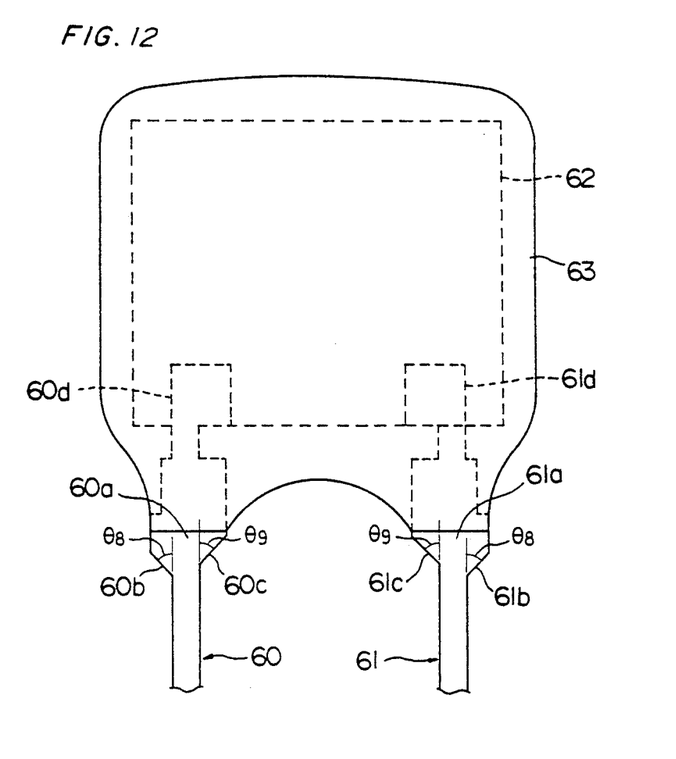
FIG. 12 is a front elevational view showing the appearance of a two-terminal electronic component according to a sixth embodiment of the present invention.

FIG. 12 shows a two-terminal electronic component according to a sixth embodiment of the present invention. Configurations of lead terminals 60 and 61 of this embodiment are substantially similar to those of the outer lead terminals 50 and 52 of the fifth embodiment. The lead terminals 60 and 61 are provided with inclined edges 60b, 60c, 61b and 61c having different end positions on leg-side edges of body portions 60a and 61a. Inclinations $\theta_8$ of the outer inclined edges 60b and 61b are equivalent to inclinations $\theta_9$ of the inner inclined edges 60c and 61c. Head portions 60d and 61d of the lead terminals 60 and 61 are connected to electrodes provided on front and back surfaces of an element 62, which is similar to that of the second embodiment. A protective resin member 62 seals the periphery of the element 62.

Figure 13:
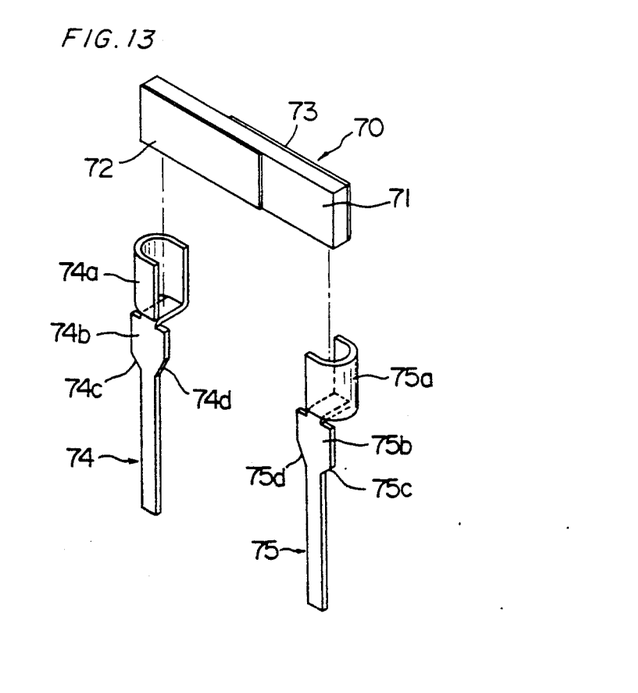
FIG. 13 is a exploded perspective view showing a two-terminal electronic component according to a seventh embodiment of the present invention.

FIG. 13 shows a two-terminal electronic component according to a seventh embodiment of the present invention. An element 70 of this embodiment is a well-known oscillator vibrating in a thickness shear mode, which comprises an elongated thin-plate piezoelectric ceramic substrate 71 and electrodes 72 and 73 provided on front and back surfaces thereof in ranges of about ⅔ of the overall length from opposite ends. Lead terminals 74 and 75 are provided with cup-type head portions 74a and 75a which are opposite to each other, such that both ends of the element 70 are inserted in the head portions 74a and 75a and connected and fixed thereto with solder or the like. The lead terminals 74 and 75 are provided with inclined edges 74c, 74d, 75c and 75d having different inclinations on leg-side edges of body portions 74b and 75b, such that inclinations of the outer inclined edges 74c and 75c are greater than those of the inner inclined edges 74d and 75d, similarly to the lead terminals 1 and 3 of the first embodiment. A protective resin member (not shown) seals the periphery of the element 70, including the head portions 74a and 75a of the lead terminals 74 and 75.

In this embodiment, the inclined edges may be formed only on the outer side edges of the body portions 74b and 75b similarly to the third embodiment (FIG. 8), or inner and outer inclined edges may be formed with displaced lowest ends similarly to the fifth embodiment (FIG. 10).

Figure 14:
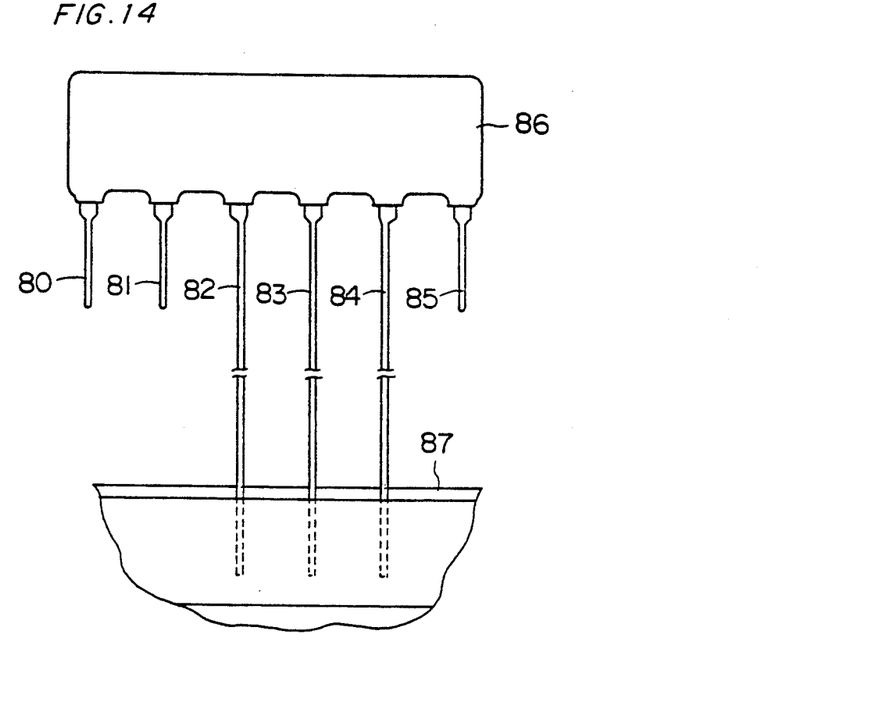
FIG. 14 is a front elevational view showing a six-terminal electronic component according to an eighth embodiment of the present invention, which is held by a tape.
Figure 15:
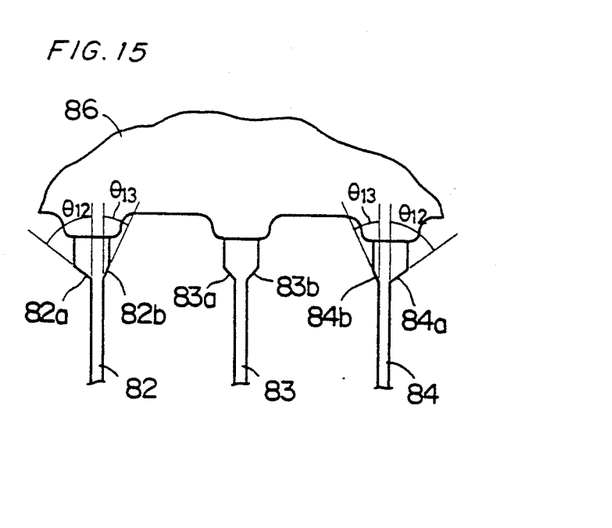
FIG. 15 is a partially enlarged view of the embodiment shown in FIG. 14.

FIGS. 14 and 15 show an eighth embodiment of the present invention. This embodiment provides an electronic component for automatic insertion, which has six lead terminals 80 to 85. The periphery of an element (not shown) is sealed with a protective resin member 86. Among the lead terminals 80 to 85, three adjacent lead terminals 82 to 84 are elongated, so that forward end portions thereof are held by a tape 87. In order to automatically insert the electronic component in a printed circuit board, the elongated lead terminals 82 to 84 are separated from the tape 87 and then all lead terminals 80 to 85 are inserted in the printed circuit board, while only the three elongated lead terminals 82 to 84 are cut and clinched. As hereinabove described, it is not known to cut and clinch four or more lead terminals by an existing automatic inserter.

In the aforementioned electronic component, the outer pair of clinched lead terminals 82 and 84 are provided with inclined edges 82a, 82b, 84a and 84b having different inclinations, such that the inclinations $\theta_{12}$ of the outer inclined edges 82a and 84a are greater than inclinations $\theta_{13}$ of the inner inclined edges 82b and 84b. The central lead terminals 83 has inclined edges 83a and 83b, whose inclinations are equivalent to the inclinations $\theta_{12}$ of the outer inclined edges 82a and 84a. Also in this case, it is possible to suppress cracking of the protective resin member 86 in automatic insertion, similarly to the first embodiment.

Figure 16:
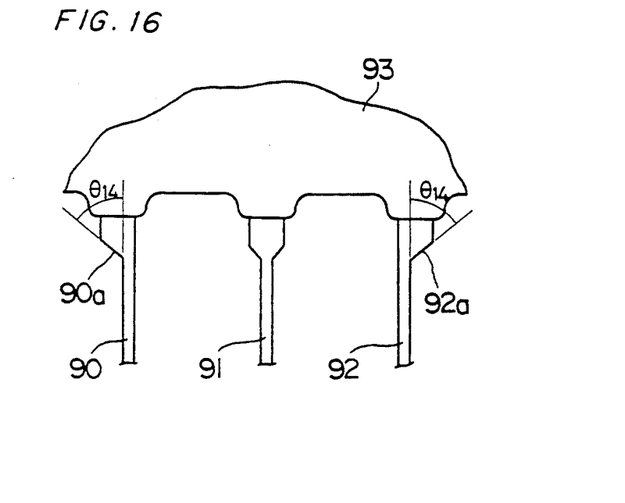
FIG. 16 is a partially enlarged view showing an electronic component according to a ninth embodiment of the present invention.

FIG. 16 shows a ninth embodiment of the present invention, which is applied to an electronic component similar to that of the eighth embodiment. Among these clinched lead terminals 90 to 92, the outer lead terminals 90 and 92 are provided with inclined edges 90a and 92a having inclinations $\theta_{14}$ only on outer side edges. Since the outer lead terminals 90 and 92 have no inner inclined edges similarly to the third embodiment (FIG. 8), the outer inclined edges 90a and 92a necessarily come into contact with upper edge portions of through holes which are provided in a printed circuit board, whereby it is possible to suppress cracking of a protective resin member 93.

Figure 17:
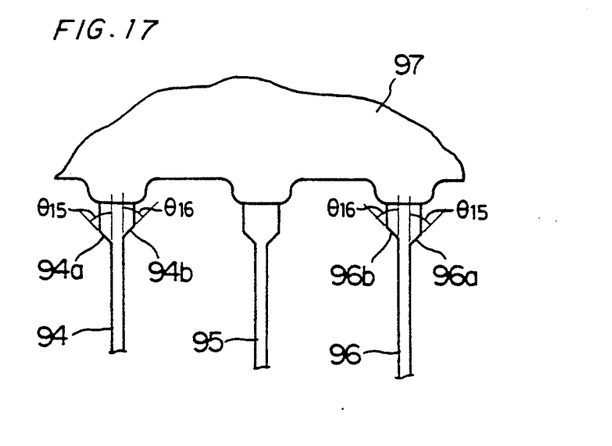
FIG. 17 is a partially enlarged view showing an electronic component according to a tenth embodiment of the present invention.

FIG. 17 shows a tenth embodiment of the present invention, which is applied to an electronic component similar to that of the eighth embodiment. Among three clinched lead terminals 94 to 96, the outer lead terminals 94 and 96 are provided on side edges with inclined edges 94a, 94b, 96a and 96b having different lowest ends. Inclinations $\theta_{15}$ of the outer inclined edges 94a and 96a are equivalent to inclinations $\theta_{16}$ of the inner inclined edges 94b and 96b. Also in this case, the outer inclined edges 94a and 96a of the outer lead terminals 94 and 96 necessarily come into contact with upper edge portions of through holes which are provided in a printed circuit board, whereby it is possible to suppress cracking of a protective resin member 97.

The present invention is not restricted to the aforementioned embodiments, but various modifications and corrections can be applied within the scope of the present invention.

For example, a capacitor, a transistor or a resistor can be employed as the element in the present invention, in addition to a piezoelectric component such as a filter, a trap, a discriminator, an oscillator, a surface wave filter or the like. Further, the present invention is not restricted to a single element, but may comprise a plurality of the same type or different types of elements.

In addition to the three-terminal, two-terminal and six-terminal electronic components shown in the above embodiments, the present invention is also applicable to electronic components comprising other numbers of terminals such as four, five, seven and more terminals.

When the present invention is applied to a three-terminal electronic component, the central terminal may be implemented by a straight terminal having no inclined edges.

In place of the aforementioned T-clinch method carried out by the automatic inserter, the terminals may be clinched by an N-clinch method of obliquely bending the terminals with respect to the board thickness direction, to attain an effect similar to the above.

The present invention is applicable not only to a component for automatic insertion, but also to a bulk product, which is a component for manual insertion, as a matter of course.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic component, comprising: an element; a protective resin member sealing the periphery of said element;
a couple of plate-type lead terminals projecting from said protective resin member in the same direction and having head portions connected to said element, elongated leg portions, and body portions being wider than said leg portions, provided between said head portions and leg portions and positioned at sealing lines of said protective resin member;
wherein said body portions on leg-side ends are provided with outer and inner inclined edges which make said body portions gradually narrowed toward said leg portions, such that inclinations $\theta_1$ of said outer inclined edges with respect to a leg-projecting direction are greater than inclinations $\theta_2$ of said inner inclined edges with respect to the same direction, and lowest ends of said outer inclined edges are at the same level as those of said inner inclined edges.

2. An electronic component in accordance with claim 1,
further comprising a third plate-type lead terminal between said lead terminals projecting from said protective resin member in the same direction as outer ones and having a head portion connected to said element, an elongated leg portion, and a body portion being wider than said leg portion, provided between said head portion and leg portion and positioned at a sealing line of said protective resin member,
and said body portion of said central lead terminal is provided on leg-side ends with inclined edges which make said body portion gradually narrowed toward said leg portion, such that inclinations $\theta_3$ and $\theta_4$ of said inclined edges with respect to said leg-projecting direction are identical to each other and equivalent to inclinations $\theta_1$ of said outer inclined edges of said outer lead terminals, and lowest ends of inclined edges of central lead terminal are at the same level as those of said outer inclined edges.

3. An electronic component in accordance with claim 1, wherein
said inclinations $\theta_1$ of said outer inclined edges are at about 43°.

4. An electronic component in accordance with claim 2,
further comprising at least a fourth plate-type lead terminal arranged beside three adjacent said lead terminals, all projecting from said protective resin member in the same direction.

5. An electronic component in accordance with claim 1, wherein
said element is formed of an energy trapped type piezoelectric ceramic substrate, and said protective resin member sealing said substrate has a property of absorbing wax for forming cavities.

6. An electronic component, comprising:
an element;
a protective resin member sealing the periphery of said elements;
a couple of plate-type lead terminals projecting from said protective resin member in the same direction and having head portions connected to said element, elongated leg portions, and body portions being disposed between said head portions; sand and said leg portions and positioned at sealing lines of said protective resin member;
wherein said body portion have outer inclined edges and inner inclined edges tapering gradually toward said leg portions, and lowermost ends of said outer inclined edges are closer to said leg portions than lowermost ends of said inner inclined edges.

7. An electronic component in accordance with claim 6, further comprising a central plate-type lead terminal between said couple of plate-type lead terminals projecting from said protective resin member in the same direction of said couple of plate-type lead terminals, and said central plate-type lead terminal having a head portion connected to said element, an elongated leg portion, and a body portion which is wider than said leg portion of said central plate-type lead terminal, said leg portion of said central plate-type lead terminal being disposed between said head portion of said central plate-type lead terminal and said leg portion of said central plate-type lead terminal and positioned at a sealing line of said protective resin member, and said body portion of said central plate-type lead terminal having inclined edges tapering gradually toward said leg portion of said central plate-type lead terminal, such that inclinations $\theta_{10}$ and $\theta_{11}$ of said inclined edges are identical to each other with respect to said leg-projecting direction and are equivalent to inclinations $\theta_8$ of said outer inclined edges of said coupler of plate-type lead terminals, and lowermost ends of said inclined edges of said central plate-type lead terminal are at the same level as said lowermost ends of said outer inclined edges of said couple of plate-type lead terminals.

8. An electronic component in accordance with claim 6, wherein said inclinations $\theta_8$ of said outer inclined edges of said couple of plate-type lead terminals are at about 43°.

9. An electronic component in accordance with claim 7, further comprising at least a fourth plate-type lead terminal arranged beside said couple of plate-type lead terminals and said central plate-type lead terminal all projecting from said protective resin member in the same direction.

10. An electronic component in accordance with claim 6, wherein
said element is formed of an energy trapped type piezoelectric ceramic substrate, and said protective resin member sealing said substrate has a property of absorbing wax for forming cavities.

* * * * *